(12) United States Patent
Schneegans et al.

(10) Patent No.: US 9,640,419 B2
(45) Date of Patent: May 2, 2017

(54) CARRIER SYSTEM FOR PROCESSING SEMICONDUCTOR SUBSTRATES, AND METHODS THEREOF

(71) Applicant: Infineon Technologies AG, Neubiberg (DE)

(72) Inventors: Manfred Schneegans, Vaterstetten (DE); Martin Mischitz, Wernberg (AT); Michael Roesner, Villach (AT); Michael Pinczolits, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/451,043

(22) Filed: Aug. 4, 2014

(65) Prior Publication Data
US 2016/0035560 A1    Feb. 4, 2016

(51) Int. Cl.
| H01L 21/683 | (2006.01) |
| --- | --- |
| H01L 21/02 | (2006.01) |
| H01L 23/00 | (2006.01) |
| H01L 23/495 | (2006.01) |

(52) U.S. Cl.
CPC .......... *H01L 21/6836* (2013.01); *H01L 24/02* (2013.01); *H01L 24/28* (2013.01); *H01L 24/32* (2013.01); *H01L 23/49551* (2013.01); *H01L 2221/68327* (2013.01); *H01L 2224/32245* (2013.01); *H01L 2224/48091* (2013.01); *H01L 2224/48247* (2013.01); *H01L 2224/48465* (2013.01); *H01L 2224/73265* (2013.01); *H01L 2924/10158* (2013.01); *H01L 2924/13055* (2013.01); *H01L 2924/13091* (2013.01); *H01L 2924/181* (2013.01)

(58) Field of Classification Search
CPC ............... H01L 21/6836; H01L 21/02016
USPC ............................................. 257/30
See application file for complete search history.

(56) References Cited

U.S. PATENT DOCUMENTS

| 5,480,503 | A | * | 1/1996 | Casey ................ H01L 21/4857 156/235 |
| 5,919,325 | A | * | 7/1999 | Goebel et al. ............. 156/89.16 |
| 6,174,829 | B1 | * | 1/2001 | Jean ........................ C03C 14/00 156/89.12 |
| 6,423,570 | B1 | | 7/2002 | Ma et al. |
| 7,728,507 | B2 | * | 6/2010 | Winter et al. ................. 313/498 |
| 8,391,013 | B2 | * | 3/2013 | Fischer et al. ................ 361/748 |
| 9,165,821 | B2 | | 10/2015 | Rogalli et al. |
| 2003/0119431 | A1 | * | 6/2003 | Boyd et al. .................. 451/289 |
| 2005/0051253 | A1 | * | 3/2005 | Tosa et al. ................. 156/89.11 |
| 2005/0169818 | A1 | * | 8/2005 | Ohno et al. .................. 422/177 |

(Continued)

OTHER PUBLICATIONS

Fischer et al, "Silicon on Ceramics—A New Concept for Micro-Nano-Integration on Wafer Level", NSTI-Nanotech 2008, www.nsti.org, vol. 3, 157-160.*

(Continued)

*Primary Examiner* — Jarrett Stark
*Assistant Examiner* — Charles N Ausar-El
(74) *Attorney, Agent, or Firm* — Slater Matsil, LLP

(57) ABSTRACT

In accordance with an alternative embodiment of the present invention, a method for forming a semiconductor device includes applying a paste over a semiconductor substrate, and forming a ceramic carrier by solidifying the paste. The semiconductor substrate is thinned using the ceramic carrier as a carrier.

21 Claims, 9 Drawing Sheets

(56) References Cited

U.S. PATENT DOCUMENTS

| | | | |
|---|---|---|---|
| 2005/0186407 A1* | 8/2005 | Mori et al. | 428/210 |
| 2008/0001290 A1 | 1/2008 | Chou et al. | |
| 2008/0233416 A1* | 9/2008 | Takase | 428/480 |
| 2010/0167017 A1* | 7/2010 | Takamatsu et al. | 428/168 |
| 2011/0018116 A1 | 1/2011 | Feng | |
| 2013/0026633 A1 | 1/2013 | Schneegans et al. | |
| 2013/0032855 A1 | 2/2013 | Macheiner et al. | |
| 2014/0197523 A1* | 7/2014 | Otremba et al. | 257/666 |
| 2014/0210054 A1* | 7/2014 | Kosub et al. | 257/618 |
| 2014/0217597 A1* | 8/2014 | Lin | H01L 24/19 257/773 |
| 2014/0264865 A1 | 9/2014 | Schneegans et al. | |
| 2015/0102498 A1* | 4/2015 | Enicks et al. | 257/774 |
| 2015/0206802 A1 | 7/2015 | Roesner et al. | |
| 2015/0214095 A1 | 7/2015 | Mischitz et al. | |

OTHER PUBLICATIONS

Fischer et al, "Bonding of ceramic and silicon—new options and applications", Technische Universitat Llmenau, also cited as Fischer et al, "Bonding of ceramic and silicon—new options and applications", Smart Systems, 2007 in U.S. Pat. No. 8,391,013.*
Disco Corporation, "Taiko Process," Kiru-Kezuru-Migaku Technologies, http:www.discousa.com/eg/solution/library/taiko.html, Jul. 28, 2014, pp. 1-3.

* cited by examiner

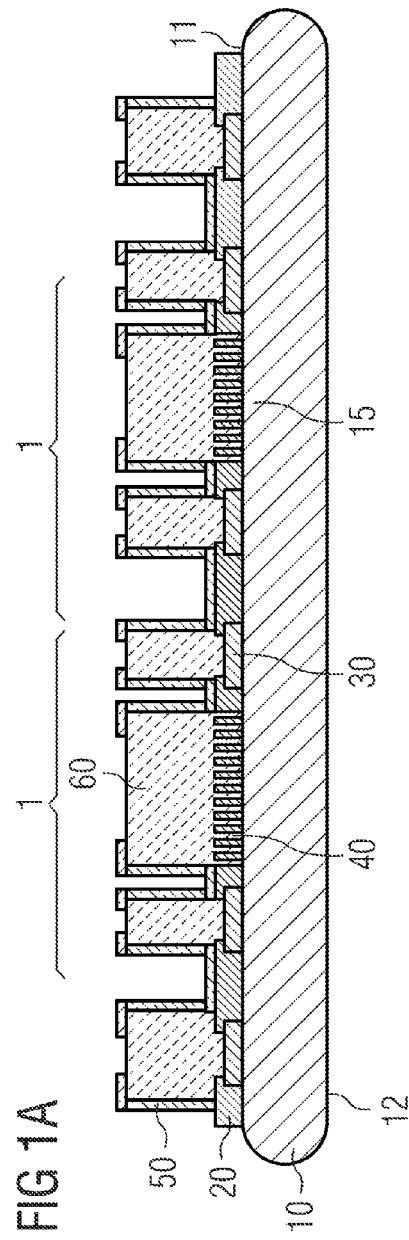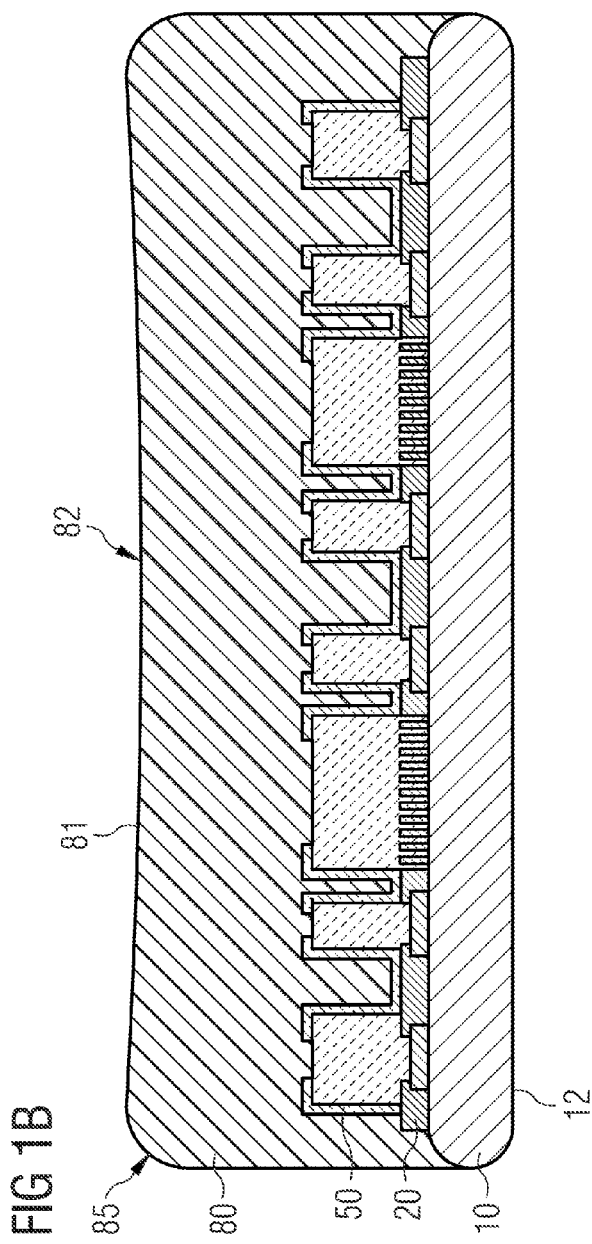

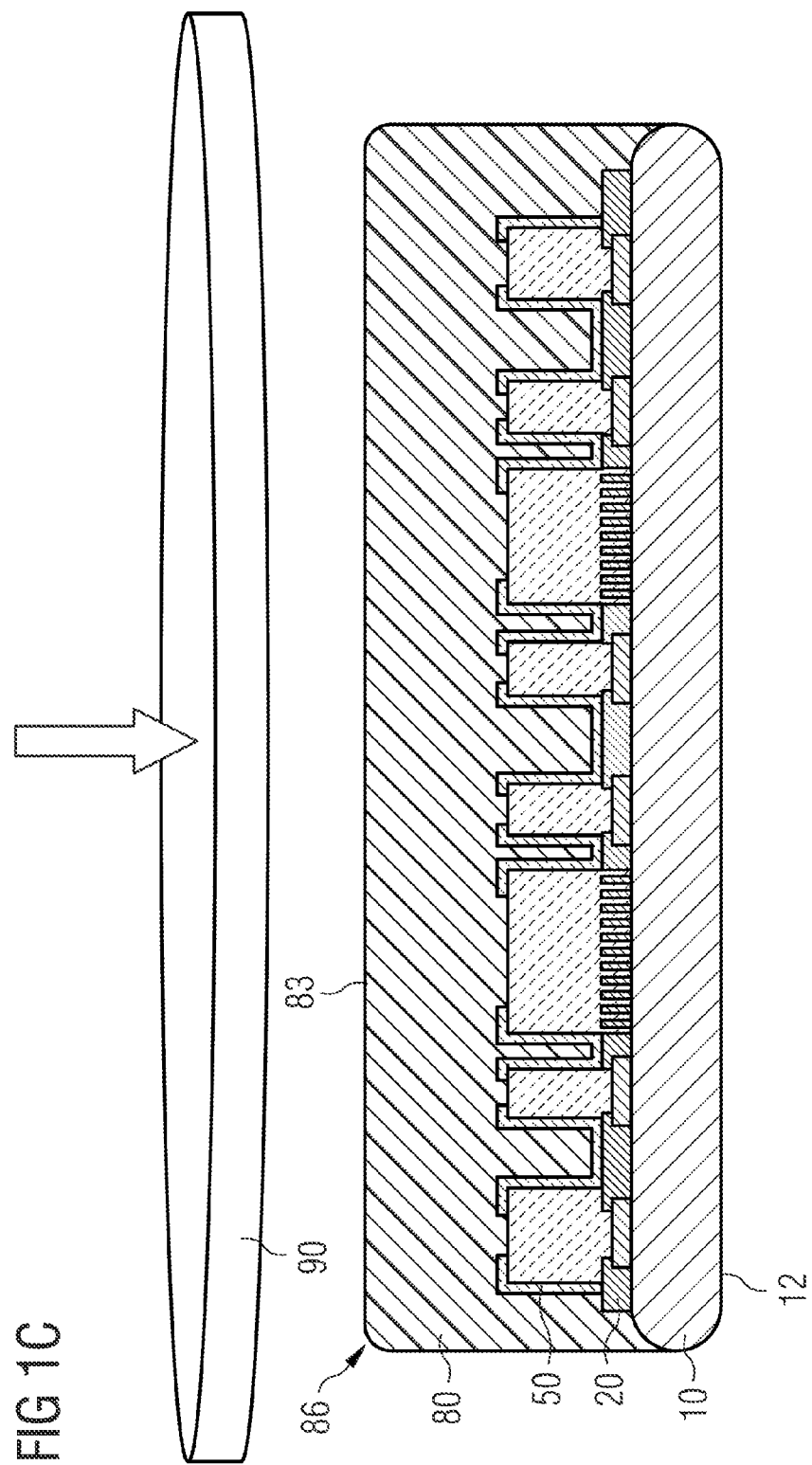

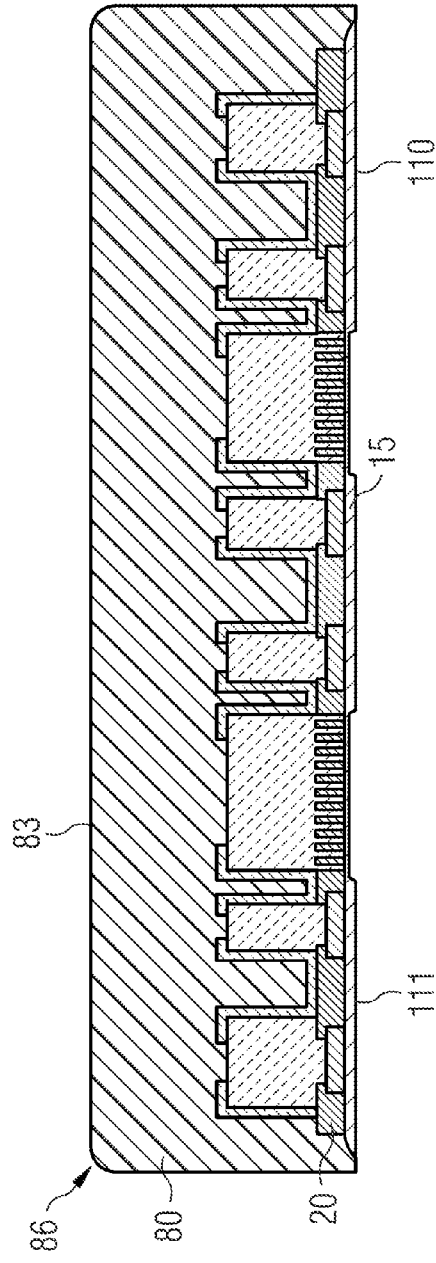
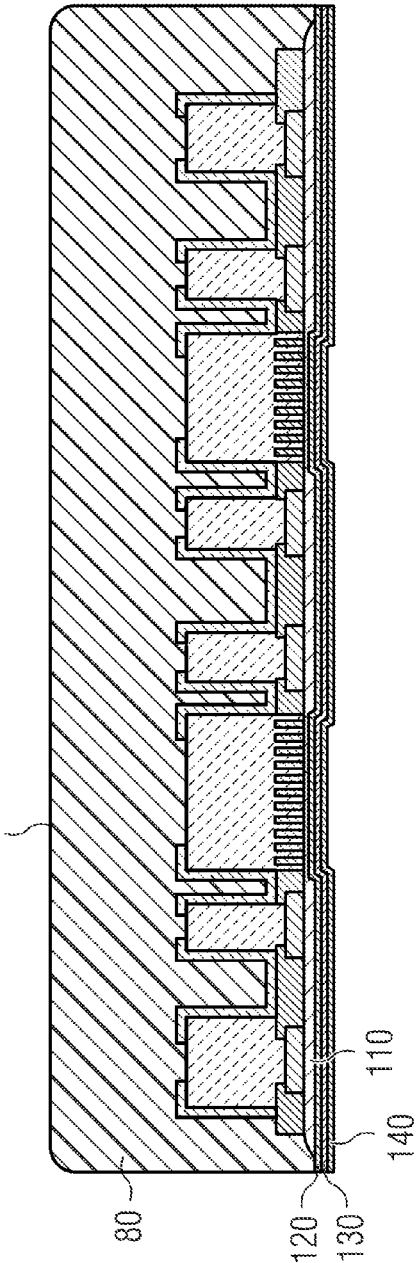
FIG 2A
FIG 2B

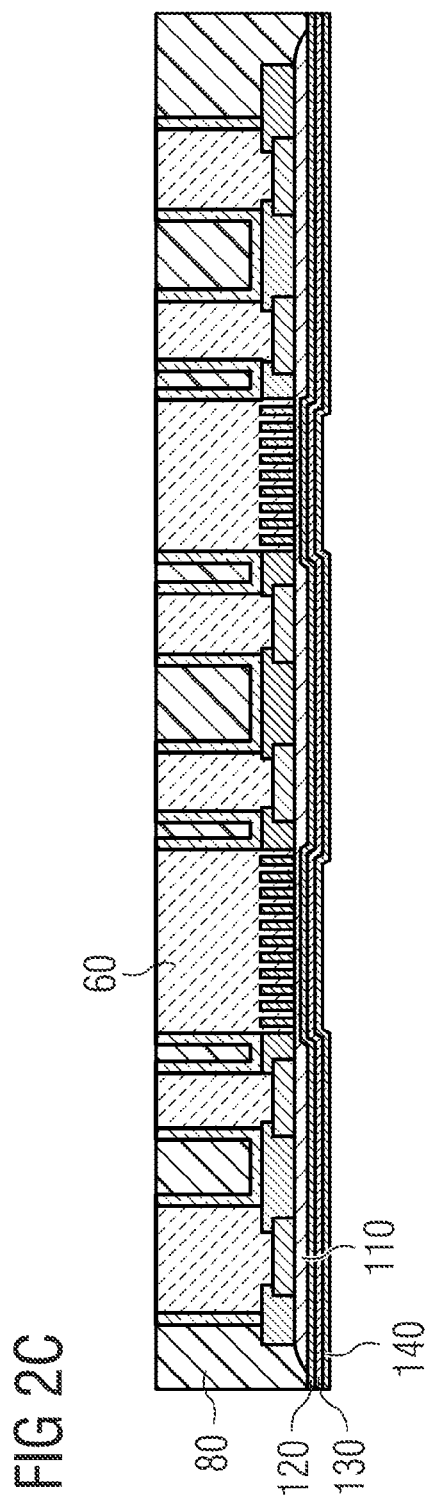

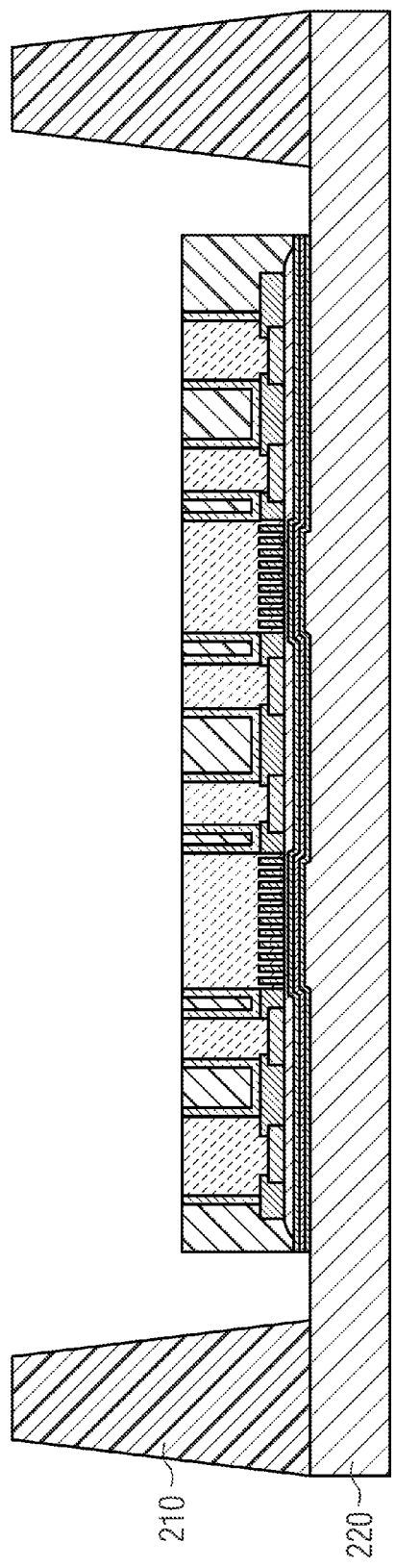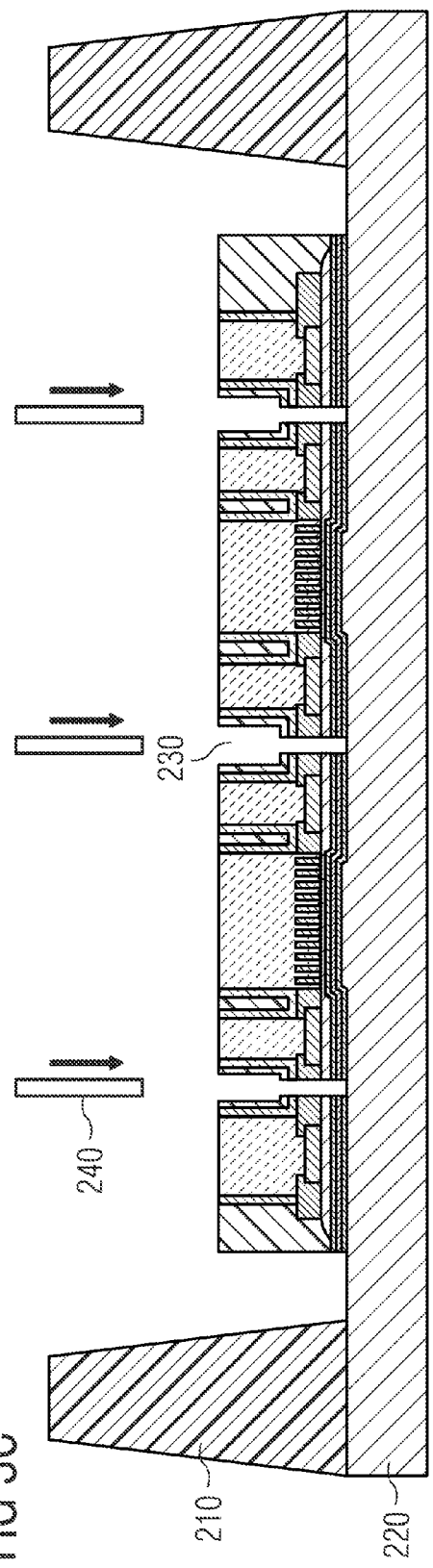

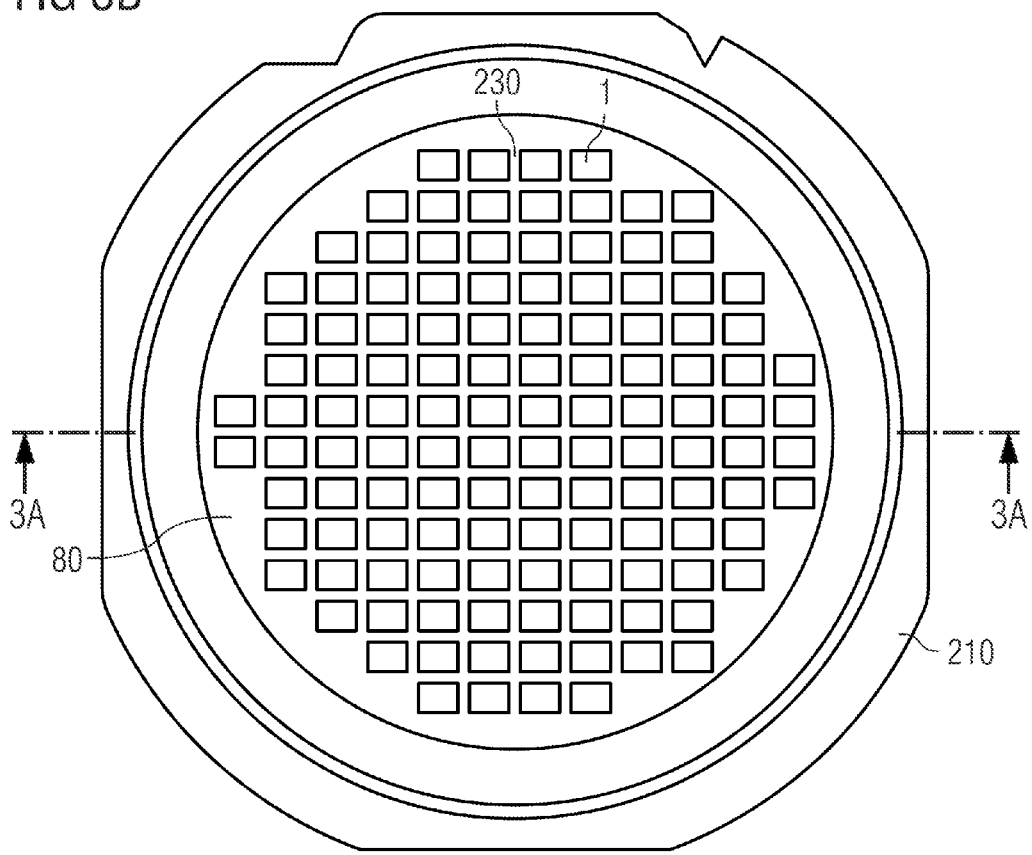

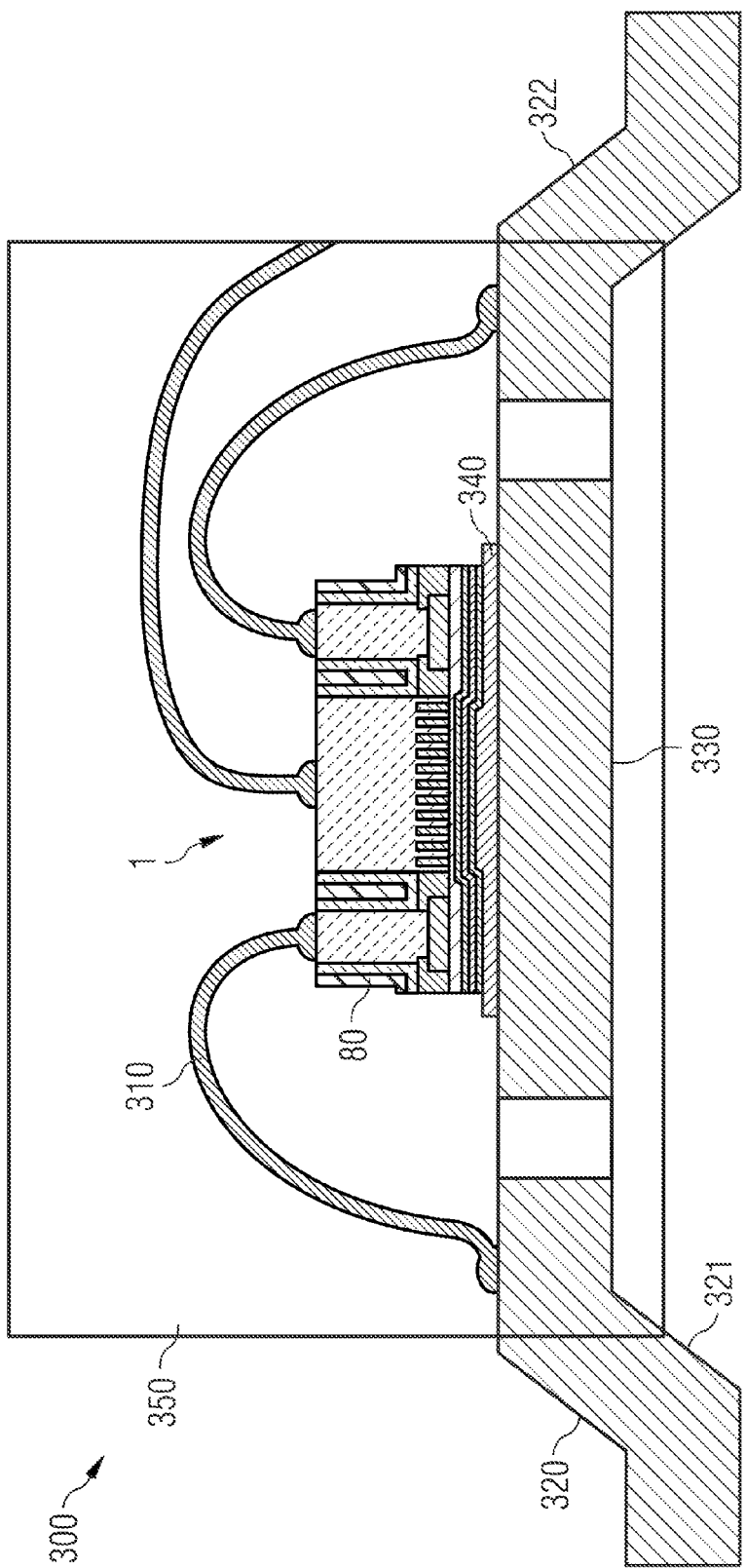

CARRIER SYSTEM FOR PROCESSING SEMICONDUCTOR SUBSTRATES, AND METHODS THEREOF

TECHNICAL FIELD

The present invention relates generally to semiconductor processing, and, in particular embodiments, to carrier system for processing semiconductor substrates, and methods thereof.

BACKGROUND

Semiconductor devices are used in many electronic and other applications. Semiconductor devices may comprise integrated circuits that are formed on semiconductor wafers. Alternatively, semiconductor devices may be formed as monolithic devices, e.g., discrete devices. Semiconductor devices are formed on semiconductor wafers by depositing many types of thin films of material over the semiconductor wafers, patterning the thin films of material, doping selective regions of the semiconductor wafers, etc.

In a conventional semiconductor fabrication process, a large number of semiconductor devices are fabricated in a single wafer. Each wafer is processed either in batch mode or individually because some processes work best on one wafer at time. Processes that require mechanical forces such as polishing, singulation, grinding, and others are not only individually handled but may also be mounted on a carrier for providing additional support and stability during processing.

SUMMARY

In accordance with an embodiment of the present invention, a method for forming a semiconductor device comprises forming device regions in a semiconductor substrate comprising a first side and a second side. The device regions are formed adjacent the first side. The first side of the semiconductor substrate is mounted on a carrier. The semiconductor substrate and the carrier are singulated to form a plurality of semiconductor dies.

In accordance with an alternative embodiment of the present invention, a method for forming a semiconductor device comprises applying a paste over a semiconductor substrate, and forming a ceramic carrier by solidifying the paste. The semiconductor substrate is thinned using the ceramic carrier as a carrier.

In accordance with an alternative embodiment of the present invention, a semiconductor chip comprises a diced semiconductor substrate, and a diced carrier disposed over the semiconductor substrate.

BRIEF DESCRIPTION OF THE DRAWINGS

For a more complete understanding of the present invention, and the advantages thereof, reference is now made to the following descriptions taken in conjunction with the accompanying drawings, in which:

FIG. 1A illustrates a cross-sectional view of a semiconductor device during fabrication in accordance with an embodiment of the present invention;

FIG. 1B illustrates a cross-sectional view of a semiconductor device during the forming of a ceramic carrier in accordance with an embodiment of the present invention;

FIG. 1C illustrates a cross-sectional view of a semiconductor device during fabrication after forming a ceramic carrier in accordance with an embodiment of the present invention;

FIG. 2A illustrates a cross-sectional view of a semiconductor device during fabrication after thinning the substrate using the ceramic carrier in accordance with an embodiment of the present invention;

FIG. 2B illustrates a cross-sectional view of a semiconductor device during fabrication after thinning the substrate and deposition of a backside metallization using the ceramic carrier as the carrier in accordance with an embodiment of the present invention;

FIG. 2C illustrates the substrate and the carrier after thinning the carrier in accordance with an embodiment of the present invention;

FIGS. 3A and 3B illustrate the carrier and the substrate placed on a frame with a dicing tape in preparation for singulation in accordance with an embodiment of the present invention, wherein FIG. 3A illustrates a cross-sectional view and FIG. 3B illustrates a top view;

FIG. 3C illustrates a dicing process during a subsequent stage in processing the semiconductor chip in accordance with an embodiment of the present invention;

FIG. 5 illustrates a semiconductor package comprising a chip formed in accordance with embodiments of the present invention.

DETAILED DESCRIPTION OF ILLUSTRATIVE EMBODIMENTS

Figure 1D:
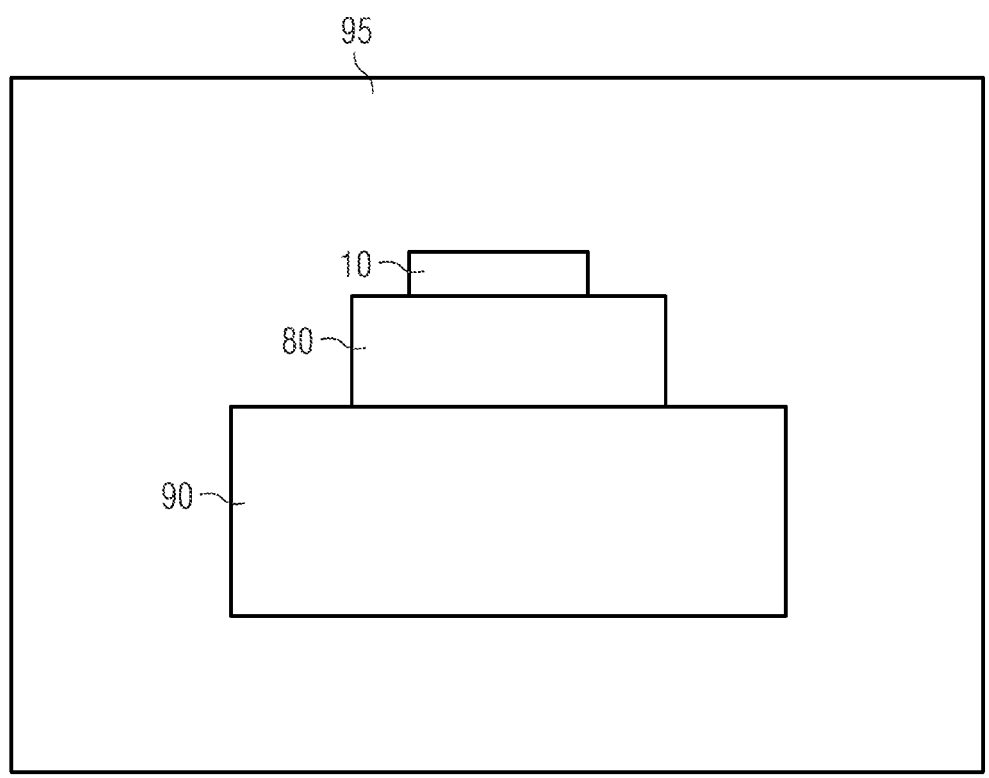
FIG. 1D illustrates processing of the semiconductor substrate using the carrier system in accordance with embodiments of the present invention.

Modern semiconductor chips are being manufactured at reduced thickness to improve performance, for example, by reducing thermal effects. Thin chips are increasingly becoming necessary especially for high power applications. However, very thin chips require processing of thin wafers, which may be thinner than 60 µm. Such thin wafers cannot be processed without additional mechanical support. Accordingly, sophisticated carrier systems are needed to support such thin wafers. Without such carrier systems the processing and assembly of very thin chips is limited.

State of the art systems to support thin wafers use glue to attach a glass carrier wafer on top of the Si wafer. After processing, the glass carrier wafer and the glue are removed. However, thermal stability of such glue based joints is limited, for example, up to 240° C. below 2 minutes. Alternatively, permanent carrier of, e.g., glass grids are connected to the silicon wafer by a glass solder. Thermal stability of those contacts is in the range of 300° C.-800° C. But pre-patterned glass grids are mechanically limited as they need glass bars wider than 150 µm. Therefore, these may not be used wafers with small kerfs (e.g., 30 µm-100 µm).

Alternatively, mold compounds are used as carrier systems, for example, in embedded wafer level processing. But such techniques have limited thermal stability, e.g., up to 280° C.

In various embodiments described herein below, a ceramic paste is formed over the wafer followed by a sintering process to form a permanent, thermally stable, and isolating carrier system. After performing the functions of a carrier, the wafer along with the carrier is singulated into individual chips so that portions of the carrier become part of the assembled device.

Embodiments of the present invention will be described further using the methods described in FIGS. 1-4 and the semiconductor package described in FIG. 5.

FIG. 1A illustrates a cross-sectional view of a semiconductor device during fabrication in accordance with an embodiment of the present invention.

Referring to FIG. 1A, a semiconductor substrate 10 after the completion of front end processing and back end processing is illustrated. The semiconductor substrate 10 has a plurality of semiconductor devices, i.e., chips 1, formed within. Each of the chips 1 may be any type of chip. For example, each of the chips 1 may be a logic chip, a memory chip, an analog chip, a high power switch, and other types of chips. Each of the chips 1 may comprise a plurality of devices such as transistors or diodes forming an integrated circuit or may be a discrete device such as a single transistor or a single diode.

In various embodiments, the semiconductor chip 1 may comprise a power semiconductor device, which may be a discrete device in one embodiment. In one embodiment, the semiconductor chip 1 is a two terminal device such as a PIN diode or a Schottky diode. In one or more embodiments, the semiconductor chip 1 is a three terminal device such as a power metal insulator semiconductor field effect transistor (MISFET or MOSFET), a junction field effect transistor (JFET), bipolar junction transistor (BJT), an insulated gate bipolar transistor (IGBT), or a thyristor.

In one embodiment, the substrate 10 may comprise a semiconductor wafer such as a silicon wafer. In other embodiments, the substrate 10 may be a wafer comprising other semiconductor materials including alloys such as SiGe, SiC or compound semiconductor materials such as GaAs, InP, InAs, GaN, sapphire, silicon on insulation, for example. In various embodiments, the substrate 10 may include a layer of silicon carbide (SiC). In one embodiment, the substrate 10 may include a layer of gallium nitride (GaN).

As an illustrate the substrate 10 may be a 300 mm silicon wafer, which may have a thickness of about 750 µm to about 800 µm while in another embodiment the substrate 10 may be a 200 mm, 300 mm, or 450 mm silicon wafer, which may have a thickness of about 700 µm to about 750 µm.

Referring to FIG. 1A, device regions 15 are disposed within the substrate 10. The device regions 15 may include doped regions in various embodiments. Further, some portion of the device regions 15 may be formed over the substrate 10. The device regions 15 may include active regions such as channel regions of transistors.

The substrate 10 comprises a top surface 11 and an opposite bottom surface 12. In various embodiments, the device regions 15 are formed closer to the top surface 11 of the substrate 10 than the bottom surface 12. Active devices may be formed in device regions 15 of the substrate 10. Device regions 15 extends over a depth, which depending on the device, is about 5 µm to about 50 µm from the top surface 11, and about 10 µm in one embodiment. Further, a final depth of the chip 1 will be determined after thinning as will be described subsequently.

In various embodiments, all necessary interconnects, connections, pads etc. for coupling between devices of the device regions 15 and/or with external circuitry are formed over the substrate 10. Accordingly, a metallization layer 20 is formed over the substrate 10. The metallization layer 20 may comprise one or more levels of metallization. Each level of metallization may comprise metal lines or vias embedded within an insulating layer. The metallization layer 20 may comprise metal lines and vias to contact the device regions 15 and also to couple different devices within each chip 1.

The front side processing is completed with the formation of patterned contact pads 60. The patterned contact pads 60 may be formed by depositing a thick layer of copper using a plating process. An imide layer 50 may be deposited over the thick layer of copper and opened to expose the patterned copper pads 60.

Typically, a passivation layer or protective layer is deposited before further processing. The protective layer is designed to help protect the metallization layer 20 as well as the device regions 15 during subsequent processing. However, in one or more embodiments, the protective layer may be omitted as this function may be advantageously be performed using the carrier system.

FIG. 1B illustrates a cross-sectional view of a semiconductor device during fabrication after forming a ceramic carrier in accordance with an embodiment of the present invention.

In various embodiments, a ceramic paste is deposited over the top surface 11 of the substrate 10. In various embodiments, the ceramic paste is deposited as a liquid using a printing process followed by drying and sintering.

In one alternative embodiment, a coating process is used to deposit the ceramic paste. In other embodiments, the ceramic paste may be deposited using processes such as spin on process, for example, during which a spin on dielectric is deposited. In other embodiments, other deposition processes may be used to deposit the paste.

In one or more embodiments, in addition to ceramic materials, pastes of silicon-oxide, alumina, magnesium oxide, titanium oxide, or similar materials may be printed and sintered to form stable oxides like ceramic pastes or concrete. In various embodiments, the ceramic paste may be a water based mixture and may exhibit self-hardening like concrete.

In various embodiments, the ceramic paste has a slurry like viscosity preventing it from flowing away from the substrate 10. In some embodiments, the ceramic paste may be formed by a mixture of two components that set to form a solid material. In various embodiments, self-solidifying materials may be used as the carrier material.

Additionally in some embodiments, compound materials based on thermally stable polymers filled by organic compounds may also be used. Further embodiments may use powder materials (including ceramics and oxides) that are solidified and/or patterned using laser sintering.

The ceramic paste is sintered (heated) to form a solid material. For example, the sintering may be performed at 380° C. to about 450° C. in one or more embodiments. In another embodiment, sintering is performed at 350° C. to about 450° C. In another embodiment, sintering is performed at 400° C. to about 450° C. In further embodiments, the sintering process may be performed at a lower temperature.

After solidification, the carrier material provides electrical isolation as otherwise the various components on the substrate may create an electrical short.

In various embodiments, the solidified ceramic paste forms a ceramic carrier 80 having a top surface 81. As illustrated in FIG. 1B, the ceramic carrier 80 has a curved surface because of the surface tension of the deposited ceramic paste and/or the subsequent stress developed during sintering. The curvature of the solidified (sintered) ceramic paste may be further exasperated at edges and corners 85.

In various embodiments, the ceramic carrier 80 has a coefficient of thermal expansion similar to that of silicon.

In one or more embodiment, the thickness of the ceramic carrier 80 is at least 150 μm and about 150 μm to about 800 μm in various embodiments. In one or more embodiment, the thickness of the ceramic carrier 80 is at least 20% to 70% of the thickness of the substrate 10. The thickness of the ceramic carrier 80 is a function of the mechanical properties of the ceramic carrier 80 and the thickness and the diameter of the substrate 10. A larger substrate 10 may require a thicker ceramic carrier 80.

FIG. 1C illustrates a cross-sectional view of a semiconductor device during fabrication after forming a ceramic carrier in accordance with an embodiment of the present invention.

Referring to FIG. 1C, the top surface 81 of the ceramic carrier 80 is subjected to a polishing process to remove the curved surface 82 (illustrated in FIG. 1B). The polishing process may be performed by placing the substrate 10 on a chuck and held in position by vacuum to prevent damaging the substrate 10. A thinning tool 90, which may be a grinding tool in one embodiment, reduces the thickness of the carrier 80. In another embodiment, the thinning tool may use a chemical process such as wet etching or plasma etching to thin the carrier 80.

Subsequently, after the polishing process, the ceramic carrier 80 may have a thickness of about 60 μm to about 120 μm in various embodiments. In one or more embodiments, the thickness of the ceramic carrier 80 after the thinning is at least 5% to 15% of the thickness of the substrate 10, and about 10% of the substrate 10 in one embodiment.

Figure 4:
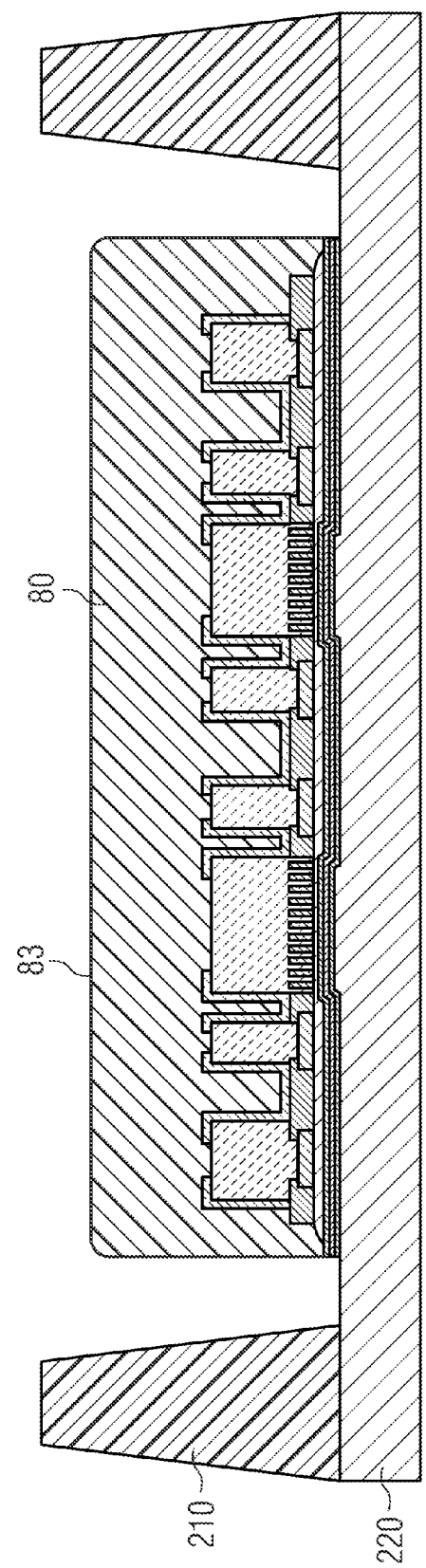
FIG. 4 illustrates an alternative embodiment of fabricating the semiconductor device in accordance with an embodiment of the present invention.

FIG. 1D illustrates processing of the semiconductor substrate using the carrier system in accordance with embodiments of the present invention Subsequent processing continues as in conventional processing except that an additional carrier may not be used in accordance with embodiments of the present invention. FIG. 1D illustrates a carrier 80 as formed using embodiments of the invention described above supporting a substrate 10 during subsequent processing. The carrier 80 may be mounted on a chuck 90 and processed within a process chamber 95, for example. FIGS. 2-4 illustrates further embodiments of such processing.

FIG. 2A illustrates a cross-sectional view of a semiconductor device during fabrication after thinning the substrate using the ceramic carrier in accordance with an embodiment of the present invention.

Using the ceramic carrier 80 as a mechanical support, the substrate 10 is thinned from the back side, i.e., from previously bottom surface 12. In various embodiments, the thinning may be performed using a mechanical grinding, chemical etching or a combination of both. The final depth of the chip 1 formed in the substrate 10 will be determined after thinning. A thinning tool, which may be a grinding tool in one embodiment, reduces the thickness of the substrate 10. In another embodiment, the thinning tool may use a chemical process such as wet etching or plasma etching to thin the substrate 10.

In one or more embodiments, the substrate 10 may be thinned without mounting on a tape. In various embodiments, thinning may be flat over the entire wafer backside or patterned by resist patterning and wet or plasma etching. For example, local thinning of substrate 10 by grinding (e.g., as described above) and following resist patterning and wet etching or plasma etching may be needed to realize thin substrate in areas of hot devices and thicker areas for mechanical stability at chip edges.

In one or more embodiments, the substrate 10 after the thinning (i.e., thinned substrate 110) may be 5 μm to about 40 μm. The device regions 15 expose a new back surface 111 of the thinned substrate 110 after the thinning. The device regions 15 are thinned to less than 10 μm, for example.

FIG. 2B illustrates a cross-sectional view of a semiconductor device during fabrication after thinning the substrate using the ceramic carrier in accordance with an embodiment of the present invention.

A back side metallization layer is formed on the exposed back surface 111 of the thinned substrate 110. In various embodiments, the back side metallization layer may comprise more than one metal layer. As an illustration, a first back side metallization layer 110, a second back side metallization layer 120, a third back side metallization layer 130, and a fourth back side metallization layer 140 are illustrated.

In one or more embodiments, the back side metallization layer may be deposited using a physical vapor deposition process. In alternative embodiments, the back side metallization layer may be deposited using other vapor deposition processes including chemical vapor deposition, atomic layer deposition, electrochemical deposition, electro-less deposition, and others.

In one or more embodiments, the back side metallization layer comprises aluminum. In an alternative embodiment, the back side metallization layer comprises copper. In a further alternative embodiment, the back side metallization layer comprises a solder compatible material, for example, may comprise one or more of silver, tin, gold, platinum, tin, lead, indium, cadmium, bismuth. Specific examples include aluminum layer, titanium layer, nickel vanadium layer, silver, gold-tin, and others for enabling hot aluminum physical vapor deposition for forming low ohmic contacts at the back side of the thinned substrate 110.

In yet other embodiments, the back side metallization layer comprises a metal silicide. In another embodiment, the back side metallization layer comprises a metal nitride such as titanium nitride, tungsten nitride, tantalum nitride.

In various embodiments, the first back side metallization layer 120 is formed by depositing titanium or tungsten, and the second back side metallization layer 130 is formed by depositing aluminum.

In various embodiments, 100 nm to about 500 nm of a third back side metallization layer 140 are deposited. The third back side metallization layer 140 may provide a solder layer for contact formation. Examples of the third back side metallization layer 140 include Au, Ag, Sn, Au alloys, Ag alloys, Sn alloys, and combinations thereof. In other embodiments 100 nm to about 10000 nm of the third back side metallization layer 140 are deposited. In various embodiments, the third back side metallization layer 140 may include multiple layers that form a solder layer, and may also protect the underlying metals from the environment. In some embodiments, copper may be used as the third back side metallization layer 140.

FIG. 2C illustrates the substrate and the carrier after thinning the carrier in accordance with an embodiment of the present invention.

Referring to FIG. 2C, the carrier 80 is thinned to a suitable thickness for packaging. The thinning of the carrier 80 opens the underlying patterned contact pads 60. In various embodiments, the carrier 80 may be thinned using a grinding process. In one or more embodiments, the thickness of the carrier 80 after the thinning is about 40 μm to about 100 μm.

However, the remaining carrier 80 after the thinning is thicker than the remaining thinned substrate 110. Without the carrier 80, the thin layer of thinned substrate 110 may warp and/or mechanically disintegrate. Accordingly, a thickness of the remaining carrier 80 is more than a thickness of the thinned substrate 110.

FIGS. 3A and 3B illustrates the carrier and the substrate placed on a frame with a dicing tape in preparation for singulation in accordance with an embodiment of the present invention. FIG. 3A illustrates a cross-sectional view and FIG. 3B illustrates a top view.

Referring to FIG. 3A, the substrate is attached to a frame 210 comprising an adhesive tape 220. The thinned substrate 110 and the carrier 80 are mounted to the adhesive tape 220 within the outer frame 210. The adhesive tape 220 may be a dicing tape in one embodiment. The frame 210, which is an annular structure, supports the adhesive tape 220 along the outer edges in one or more embodiments. In another embodiment, the adhesive tape 220 may have a substrate, e.g., polyvinyl chloride, with the coating of an adhesive layer such as an acrylic resin. In one or more embodiments, the frame 210 comprises a supporting material such as a metal or plastic (ceramic) material. In various embodiments, the inside diameter of the frame 210 is greater than the diameter of the thinned substrate 110 and the carrier 80. In alternative embodiments, the frame 210 may comprise suitable shapes other than being circular.

As illustrated in FIGS. 3A and 3B, the thinned substrate 110 and the carrier 80 are firmly secured over the central part of the adhesive tape 220 in one or more embodiments. Accordingly, the thinned substrate 110 and the carrier 80 may be securely handled during the subsequent singulation process described below.

FIG. 3C illustrates a dicing process during a subsequent stage in processing the semiconductor chip in accordance with an embodiment of the present invention.

As next illustrated in FIG. 3C, a dicing tool 240 is used to dice through dicing regions 230. The dicing regions 230 may be narrow, for example, 30 μm-100 μm in one or more embodiments. In one embodiment, the dicing tool 240 may be sawing blade. The dicing may be performed using a two-step dicing process in one embodiment.

FIG. 4 illustrates an alternative embodiment of fabricating the semiconductor device in accordance with an embodiment of the present invention.

Unlike the prior embodiments, if the carrier 80 has a higher intrinsic stress, thinning the carrier 80 without additional mechanical support (as in FIG. 2C) may crack or delaminate the carrier 80. In such embodiments, the carrier 80 with the thinned substrate 110 is attached to the adhesive tape 220 of the frame 210 prior to the thinning of the carrier 80.

After attaching the carrier 80 to the frame, thinning of the carrier 80 may be performed. Subsequent processing follows the processes described previously with respect to FIG. 3C.

Accordingly, in various embodiments, the carrier 80 provides stability during processing. Further, after dicing, the carrier 80 is integrated as part of the semiconductor chip 1 so as to provide mechanical stability to the thin layer of the thinned substrate 10.

A carrier, as described in various embodiments above is used to support the wafer mechanically. Accordingly, the carrier has to be thick enough to not crack or damage during processing of the wafer. Extremely thin layers are typically formed over the semiconductor wafer. But such layers are not a carrier because they do not mechanically support the wafer. For example, a wafer without the above mentioned carrier may crack when subjected to a grinding process even if a thin passivation layer (typically less than 100 μm) or a thick front side metal layer (typically less than 100 μm) is present.

FIG. 5 illustrates a semiconductor package comprising a chip formed in accordance with embodiments of the present invention.

Referring to FIG. 5, a semiconductor package 300 includes a lead frame over which the semiconductor chip 1 is disposed. The semiconductor chip 1 is mounted over a die paddle 330 of the lead frame. The lead frame has a plurality of leads 320 which includes a first lead 321, a second lead 322 as examples. The contact pads 60 on the front side of the semiconductor chip 1 are coupled to the plurality of leads 320 using the wire bonds 310. The back side contacts of the semiconductor chip 1, which were formed from the back side metallization layers, are directly electrically coupled to the die paddle 330. The die paddle 330 is electrically coupled directly to one of the plurality of leads 320. An encapsulant 350 is disposed around the semiconductor chip 1 and above the die paddle 330. In various embodiments, the semiconductor chip 1 may be packaged using other types of packaging process.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. As an illustration, the embodiments described in FIGS. 1-5 may be combined with each other in various embodiments. It is therefore intended that the appended claims encompass any such modifications or embodiments.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for forming a semiconductor device, the method comprising:
   forming device regions in a semiconductor wafer comprising a first side and a second side, wherein the device regions are formed in the semiconductor wafer adjacent the first side;
   forming contact pads over the semiconductor wafer to contact the device regions, the contact pads separated by openings;
   applying a liquid paste over the first side of the semiconductor wafer, the liquid paste surrounding the contact pads and filling the openings;
   sintering the liquid paste to form an isolating substrate comprising a curved top surface;
   after the sintering, planarizing the isolating substrate to form a carrier disposed over the first side of the semiconductor wafer, the carrier formed within the opening and surrounding the contact pads;
   mounting the carrier on a chuck of a process tool after the planarizing;
   performing a processing on the second side of the semiconductor wafer with the carrier mounted on the chuck; and after performing the processing on the second side, singulating the semiconductor wafer and the carrier to form a plurality of semiconductor dies.

2. The method of claim 1, further comprising:
mounting the carrier on a chuck of a process tool; and
performing a processing on the second side of the semiconductor wafer.

3. The method of claim 2, wherein performing the processing comprises performing a back side grinding process to thin the semiconductor wafer.

4. The method of claim 1, further comprising forming back side metallization over the second side of the semiconductor wafer using the planarized isolating substrate as the carrier.

5. The method of claim 1, further comprising thinning the carrier before the singulating.

6. A method for forming a semiconductor device, the method comprising:
forming device regions in a semiconductor wafer having a first side and a second side;
forming contact pads over the semiconductor wafer, the contact pads coupled to the device regions and being separated by gaps;
applying a paste over the semiconductor wafer, the paste filling the gaps and surrounding the contact pads;
forming a ceramic carrier by solidifying the paste and planarizing a curved top surface, the ceramic carrier filling the gaps and surrounding the contact pads;
thinning the semiconductor wafer using the ceramic carrier as a carrier for further processing, wherein the thinned semiconductor wafer comprises the device regions;
mounting the ceramic carrier on a chuck of a process tool after the planarizing;
performing a processing on the second side of the semiconductor wafer with the ceramic carrier mounted on the chuck; and
singulating the ceramic carrier and the thinned semiconductor wafer to form a semiconductor chip.

7. The method of claim 6, wherein the paste comprises a water based mixture.

8. The method of claim 6, further comprising thinning the ceramic carrier to expose contact pads disposed over the semiconductor wafer after thinning the semiconductor wafer.

9. The method of claim 6, wherein solidifying the paste comprises sintering the paste.

10. The method of claim 9, wherein the sintering is performed at 350° C. to about 450° C.

11. The method of claim 6, wherein the planarizing reduces the thickness of the solidified paste by at least 50%.

12. The method of claim 6, wherein the wafer is handled in vacuum during the planarizing.

13. The method of claim 6, wherein the thinning the semiconductor wafer comprises thinning without mounting on a dicing tape.

14. The method of claim 6, further comprising
mounting the wafer and the ceramic carrier on a dicing tape; and
dicing the wafer and the ceramic carrier.

15. The method of claim 14, wherein the semiconductor wafer is thinned before mounting the wafer and the ceramic carrier on the dicing tape.

16. The method of claim 14, wherein the semiconductor wafer is thinned after mounting the wafer and the ceramic carrier on the dicing tape.

17. A method for forming a semiconductor device, the method comprising:
forming device regions in a semiconductor wafer comprising a first side and a second side, and wherein the device regions are formed adjacent the first side;
forming contact pads over the semiconductor wafer to contact the device regions, the contact pads separated by openings;
applying a liquid paste over the first side of the semiconductor wafer, the liquid paste surrounding the contact pads and filling the openings, and the liquid paste covering any exposed surfaces of the first side of the semiconductor wafer;
sintering the liquid paste to form an isolating wafer comprising a curved top surface;
after the sintering, planarizing the isolating wafer to form a carrier disposed over the first side of the semiconductor wafer, the carrier formed within the opening and surrounding the contact pads;
mounting the carrier on a chuck of a process tool after the planarizing;
performing a processing on the second side of the semiconductor wafer with the carrier mounted on the chuck; and
after performing the processing on the second side, singulating the semiconductor wafer and the carrier to form a plurality of semiconductor dies.

18. The method of claim 17, wherein performing the processing comprises performing a back side grinding process to thin the semiconductor wafer.

19. The method of claim 17, further comprising forming back side metallization over the second side of the semiconductor wafer after the processing by mounting the carrier on a processing chuck for the back side metallization.

20. The method of claim 17, further comprising thinning the carrier before the singulating.

21. The method of claim 17, wherein the sintering is performed at 350° C. to about 450° C.

* * * * *